(12) United States Patent
Nakata et al.

(10) Patent No.: US 9,940,274 B2
(45) Date of Patent: Apr. 10, 2018

(54) MEMORY SYSTEM AND CONTROL METHOD OF MEMORY SYSTEM

(71) Applicant: Toshiba Memory Corporation, Minato-ku (JP)

(72) Inventors: Daisuke Nakata, Kamakura (JP); Shigeo Kurakata, Fujisawa (JP); Masashi Nakata, Yokohama (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 245 days.

(21) Appl. No.: 15/064,930

(22) Filed: Mar. 9, 2016

(65) Prior Publication Data
US 2017/0046286 A1 Feb. 16, 2017

Related U.S. Application Data

(60) Provisional application No. 62/203,057, filed on Aug. 10, 2015.

(51) Int. Cl.
| | |
|---|---|
| *G06F 13/36* | (2006.01) |
| *G06F 13/28* | (2006.01) |
| *G06F 1/30* | (2006.01) |
| *G06F 3/06* | (2006.01) |
| *G11C 5/14* | (2006.01) |

(52) U.S. Cl.
CPC .......... *G06F 13/28* (2013.01); *G06F 1/30* (2013.01); *G06F 3/0625* (2013.01); *G06F 3/0659* (2013.01); *G06F 3/0679* (2013.01); *G11C 5/148* (2013.01); *G11C 2207/2254* (2013.01); *Y02B 60/1228* (2013.01)

(58) Field of Classification Search
None
See application file for complete search history.

(56) References Cited

U.S. PATENT DOCUMENTS 8,929,140 B2    1/2015  Nagashima

FOREIGN PATENT DOCUMENTS

| JP | 2002-367382 | 12/2002 |
| JP | 2013-80540 | 5/2013 |
| JP | 5349256 | 11/2013 |

*Primary Examiner* — Hyun Nam
*Assistant Examiner* — Juanito Borromeo
(74) *Attorney, Agent, or Firm* — Oblon, McClelland, Maier & Neustadt, L.L.P.

(57) ABSTRACT

According to one embodiment, an interface of a memory system includes a circuit configured to adjust output resistance for data output. When the circuit has received a command in a second state, the circuit adjusts output resistance during a first period. The first period is a period from when the interface completes reception of the command to when the interface starts transmission of data read from the memory. The second state is a state in which power consumption is lower than that in a first state in which operation is caused by a command.

20 Claims, 6 Drawing Sheets

MEMORY SYSTEM AND CONTROL METHOD OF MEMORY SYSTEM

CROSS-REFERENCE TO RELATED APPLICATIONS

This application is based upon and claims the benefit of priority from U.S. Provisional Application No. 62/203,057, filed on Aug. 10, 2015; the entire contents of which are incorporated herein by reference.

FIELD

Embodiments described herein relate generally to a memory system, and a control method of a memory system.

BACKGROUND

In a memory system connected to a host, output resistance in data transmission from a host interface of a memory device to the host may be adjusted. In a memory system, it is desirable that the output resistance be adjusted at appropriate timing in response to a change in temperature and fluctuation in power supply voltage when operation is caused by execution of a command from a host.

DETAILED DESCRIPTION

In general, according to one embodiment, a memory system includes a memory and a controller. The controller can be connected to a host. The controller controls data transfer between the memory and the host. The state of the controller is switched between a first state and a second state. The first state is a state in which operation is caused by execution of a command. The second state is a state in which power consumption is lower than that in the first state. A first command is a command for reading data from the memory. A second command is a command for writing data into the memory. The controller includes an interface for connection to a host to enable communication with the host. The interface includes a circuit configured to adjust output resistance for data output. The circuit adjusts output resistance during a first period when the interface has received the first command in the second state. The first period is a period from when the interface completes receiving the first command to when the interface starts transmission of data read from the memory. The circuit adjusts output resistance during a second period when the interface has received the second command in the second state. The second period is a period from when the interface starts transmission of a busy signal to when the interface completes the transmission. The circuit adjusts output resistance during a third period in the first state.

Exemplary embodiments of a memory system and a control method of a memory system will be explained below in detail with reference to the accompanying drawings. The present invention is not limited to the following embodiments.

First Embodiment

Figure 1:
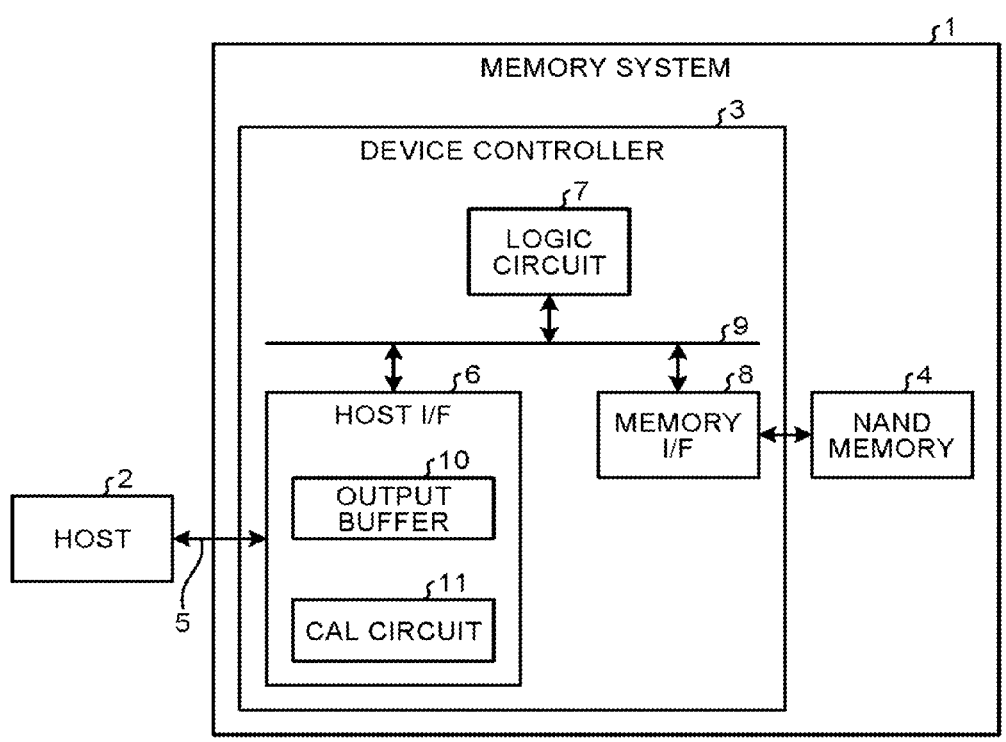
FIG. 1 is a block diagram of an information processing device including a memory system according to a first embodiment.

FIG. 1 is a block diagram of an information processing device including a memory system according to a first embodiment. The information processing device includes a memory system 1 and a host 2. The memory system 1 is an external storage device of the host 2. For example, the memory system 1 is a flash memory for embedded use based on the embedded Multi Media Card (eMMC) standard. The host 2 is a personal computer, a mobile phone, an imaging device, or the like.

The memory system includes a device controller 3 and a NAND memory 4 that is a nonvolatile memory. The NAND memory 4 is a NAND flash memory. The NAND memory 4 stores data from the host 2.

The NAND memory 4 is made of one or more memory chips each having a memory cell array. A memory cell array includes multiple memory cells arranged in a matrix. The NAND memory 4 writes and reads data in units of pages or blocks. The NAND memory 4 erases data in units of blocks each including multiple pages.

The device controller 3 is a controller for controlling data transfer between the NAND memory 4 and the host 2. A communication channel 5 connects the host and the device controller 3.

The device controller 3 includes modules of a host interface (I/F) 6, a logic circuit 7, and a memory interface (I/F) 9. A bus 9 is a transmission line between the modules.

The host I/F 6 is an interface connected to the host 2 to enable communication with the host 2. The host I/F 6 is connected to the host 2 via the communication channel 5. The host I/F 6 performs processing according to an interface standard between the host I/F 6 and the host 2 to transmit and receive data and the like to/from the host 2.

The logic circuit 7 centrally controls processes in the modules of the device controller 3. The logic circuit 7 controls data transfer between the NAND memory 4 and the host 2. The memory I/F 8 is a connection interface with respect to the NAND memory 4. The memory I/F 8 reads data from the NAND memory 4 and writes data into the NAND memory 4.

For requesting the memory system 1 to read of data stored in the NAND memory 4, the host 2 transmits a read command to the device controller 3. The read command that is the first command is a command for reading data from the NAND memory 4.

When the host I/F 6 has received the read command from the host 2, the logic circuit 7 executes the read command. The logic circuit 7 reads data stored at an address specified by the read command in the NAND memory 4. The host I/F 6 transmits the data read from the NAND memory 4 to the host 2.

For requesting the memory system 1 to write data from the host 2 into the NAND memory 4, the host transmits a write command and data to the device controller 3. The write command that is the second command is a command for writing data into the NAND memory 4.

When the host IF 6 has received the write command from the hoot 2, the logic circuit 7 executes the write command. The logic circuit 7 writes data to an address specified by the write command in the NAND memory 4.

The state of the device controller 3 can be switched between an active state that is the first state and a standby state that is the second state. The active state is a state in which the device controller 3 operates according to execution of a command from the host 2. The standby state is a state in which the power consumption of the device controller 3 is lower than that in the active state, that is, a power saving state.

When switching to the standby state is requested by the host 2 during the active state, the device controller 3 switches from the active state to the standby state. When a command is received from the host 2 during the standby state, the device controller 3 terminates the standby state and switches to the active state.

The host I/F 6 includes an output buffer 10 and a calibration (CAL) circuit 11. The output buffer 10 temporarily holds a signal output from the host I/F 6 to the host 2, and outputs the held signal. The host I/F 6 is configured to dynamically adjust output resistance (impedance) that is drive power for the output buffer 10.

The CAL circuit 11 is a circuit for adjusting the output resistance for data output from the host I/F 6 to the host 2. In the present embodiment, adjustment of the output resistance or operation for the adjustment performed by the CAL circuit 11 is also referred to as "calibration" or "calibration operation."

At the host I/F 6, the waveform of an output data signal may vary depending on variation in the drive power for the output buffer 10. The variation in the waveform of the data signal output from the host I/F 6 can cause a deviation in the timing of data loading at the host 2. As data transfer between the device controller 3 and the host 2 is faster, the influence of such a deviation in the timing on transfer performance is more significant. Adjustment of the output resistance performed by the host I/F 6 with the CAL circuit 11 can reduce deviations in the timing of data loading at the host 2.

Figure 2:
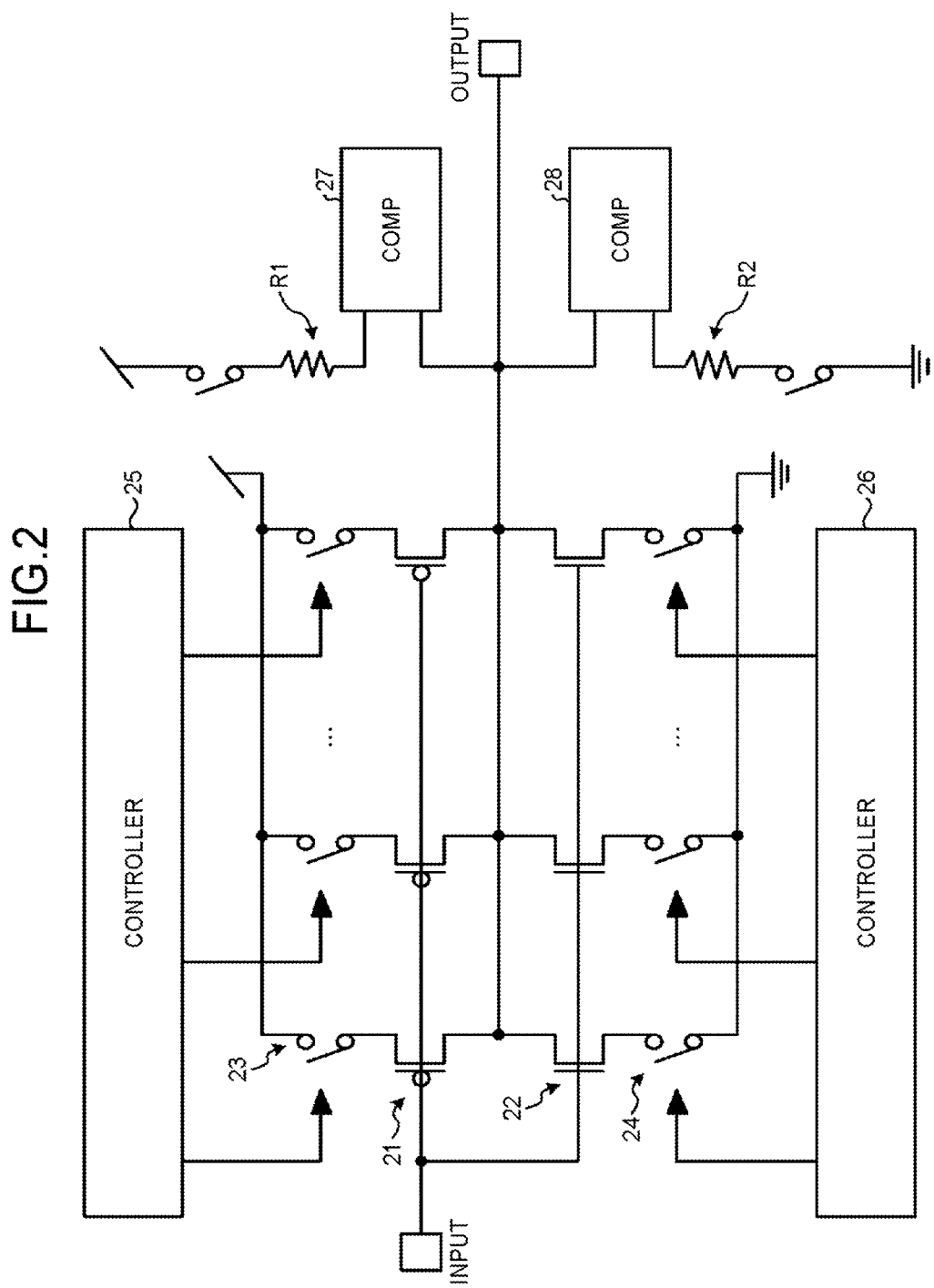
FIG. 2 is a block diagram illustrating an example configuration for adjustment of output resistance performed by a calibration (CAL) circuit illustrated in FIG. 1.

FIG. 2 is a block diagram illustrating an example configuration for adjustment of the output resistance performed by the CAL circuit illustrated in FIG. 1. The output buffer 10 includes multiple P-channel MOS transistors 21 and multiple N-channel MOS transistors 22 that are output transistors. The P-channel MOS transistors 21 are connected in parallel with one another to a data output terminal of the host I/F 6. The N-channel MOS transistors 22 are connected in parallel with one another to the data output terminal of the host I/F 6.

Each of the P-channel MOS transistors 21 is connected with a switch 23 for switching on/off output operation. A controller 25 controls the switching of the switches 23. Each of the N-channel MOS transistors 22 is connected with a switch 24 for switching on/off output operation. A controller 26 controls the switching of the switches 24.

The CAL circuit 11 includes two resistors R1 and R2 and two comparator (COMP) 27 and 28. The two resistors R1 and R2 are configured to have respective preset resistances.

The CAL circuit 11 supplies equal voltages to the resistor R1 and the P-channel MOS transistors 21 in the calibration operation. The COMP 27 compares the current in the resistor R1 and the current from the P-channel MO transistors 21. The controller 25 controls the switches 23 so that the currents compared by the COMP 27 become equal to each other. The CAL circuit 11 holds the number of P-channel MOS transistors 21 being in active states when the currents are equal to each other as a calibration coefficient that is an adjustment result.

The CAL circuit 11 supplies equal voltages to the resistor R2 and the N-channel MOS transistors 22 in the calibration operation. The COMP 28 compares the current in the resistor R2 and the current from the N-channel MOS transistors 22. The controller 26 controls the switches 24 so that the currents compared by the COMP 28 become equal to each other. The CAL circuit 11 holds the number of N-channel MOS transistors 22 being in active states when the currents at equal to each other as a calibration coefficient that is an adjustment result.

The host I/F 6 causes the P-channel MOS transistors 21 and the N-channel MOS transistors 22 perform the output operation, the number of P-channel MOS transistors 21 and the number of N-channel MOS transistors 22 corresponding to the obtained calibration coefficients. The host I/F 6 performs data transmission with the output resistance according to the obtained calibration coefficients. In this manner, the CAL circuit 11 adjusts the output resistance of the host I/F 6. The output resistance of the host I/F 6 is the output resistance according to the calibration coefficients held by the CAL circuit 11 until the calibration coefficients are updated by the calibration operation performed by the CAL circuit 11.

Note that the CAL circuit 11 may use any method to adjust the output resistance of the host I/F 6. The configuration for the adjustment of the output resistance performed by the CAL circuit 11 is not limited to that described in the present embodiment but may be modified as necessary.

Variation in the structures of output transistors due to manufacturing processes is known as one of causes of the variation in the drive power for the output buffer 10. It is also known that the variation in the drive power for the output buffer 10 is also caused by a change in temperature and fluctuation in power supply voltage when the memory system 1 operates.

The memory system 1 can adjust the variation in the drive power due to the manufacturing process by performing calibration with the CAL circuit 11 when the memory system 1 is powered on. It is desirable that the memory system 1 perform calibration at a certain frequency while the memory system 1 is activated so as to reduce variation in the drive power due to temperature and power supply voltage. The memory system 1 of the present embodiment adjusts the output resistance with the CAL circuit 11 when the memory system 1 is powered on and during predetermined periods other than the power-on period.

Figure 3:
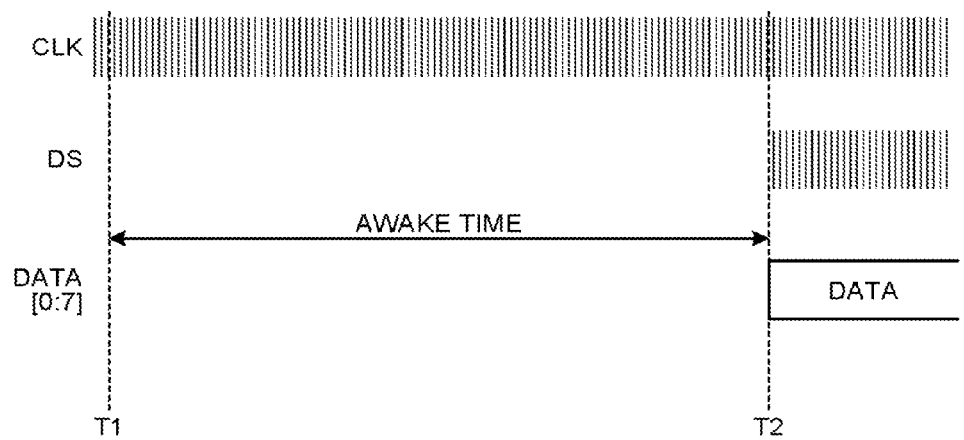
FIG. 3 is a timing chart explaining a first period during which the CAL circuit illustrated in FIG. 1 adjusts the output resistance.
Figure 4:
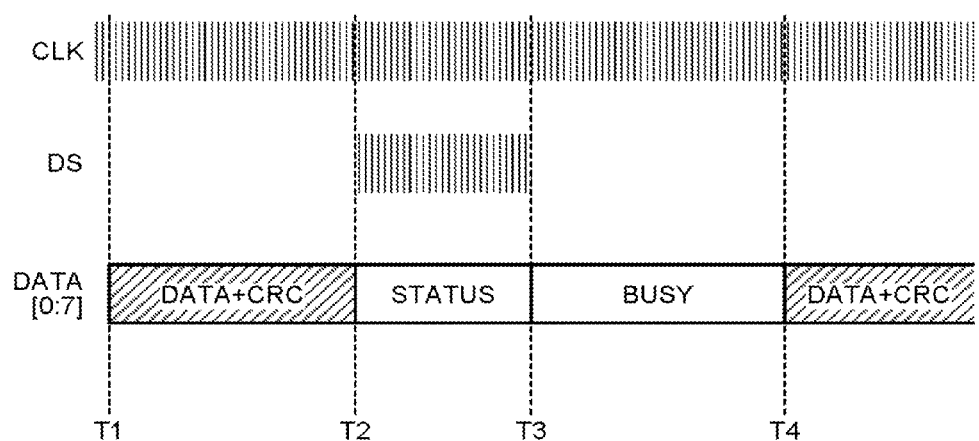
FIG. 4 is a timing chart explaining a second period during which the CAL circuit illustrated in FIG. 1 adjusts the output resistance.
Figure 5:
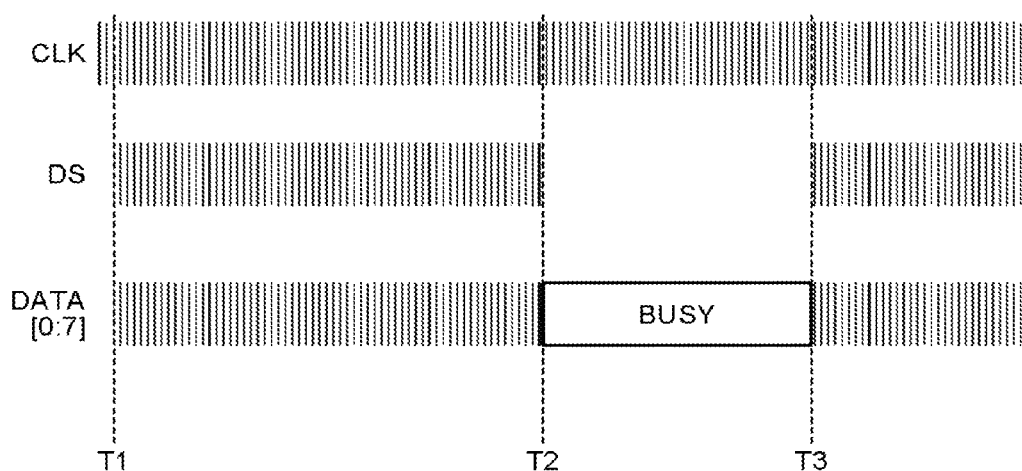
FIG. 5 is a timing chart explaining a third period during which the CAL circuit illustrated in FIG. 1 adjusts the output resistance.

Next, the periods during which adjustment of the output resistance is performed with the CAL circuit 11 will be described. FIGS. 3 to 5 are timing charts explaining the periods during which the CAL circuit illustrated in FIG. 1 adjusts the output resistance. The CAL circuit 11 performs the calibration operation during first, second, and third periods, which will be described below, in addition to the power-on period of the memory system 1.

In an operation mode HS400 defined in the Joint Electron Device Engineering Council (JEDEC), "CLK" represents a clock signal input to the device controller 3. The clock signal is supplied from the host 2 to the device controller 3. "DS" represents a data strobe (DS) signal transmitted from the device controller 3 to the host 2. The device controller 3 generates a DS signal at a timing according to the clock signal. The DS signal is a timing signal supplied from the device controller 3 to the host 2.

"DATA[0:7]" represents bidirectional data transfer between the host 2 and the device controller 3. Hatched parts represent data transfer from the host 2 to the device controller 3. White blocks represent data transfer from the device controller 3 to the host 2.

FIG. 3 illustrates the relation between the signals and the timing of data transfer after the device controller 3 in the standby state has received a read command from the host 2.

In FIG. 3, T1 represents the time when the host I/F 6 completes reception of the read command from the host 2. As a result of receiving the read command, the device controller 3 terminates the standby state and switches to the active state.

The logic circuit 7 executes the read command to read data stored in the NAND memory 4. The host I/F 6 loads the data from the NAND memory 4 in synchronization with the DS signal and outputs the data to the communication channel 5. During a period from T2, the device controller 3 transmits the DS signal and the data to the host 2. T2 represents the time when data transfer from the host I/F 6 to the host 2 is started.

The period from T1 to T2 is a period defined as a read time-out period (awake time) in the eMMC standard, for example. The memory system 1 does not read data to the host 2 during the read time-out period. The CAL circuit 11 adjusts the output resistance during the period from T1 to T2 that is a first period. In this manner, the CAL circuit 11 uses the period during which data transmission to the host 2 is not performed for performing calibration operation. After the adjustment at the CAL circuit 11 is completed, the host I/F 6 starts data transmission to the host 2.

FIG. 4 illustrates the relation between the signals and the timing of data transfer after device controller 3 has received a write command from the host 2 while the memory system 1 is in the standby state. As a result of receiving the write command, the device controller 3 terminates the standby state and switches to the active state.

In FIG. 4, T1 represents the time when the reception of the write command from the host 2 to the device controller 3 is completed. The host 2 transmits data to the device controller 3 following the write command.

Cyclic redundancy check (CRC) bits that are redundancy bits of error detecting codes are added to the data to be transmitted from the host 2 to the device controller 3. T2 represents the time when the transmission of the data and the CRC bits from the host 2 to the device controller 3 is completed.

After the device control receives data from the host 2, the logic circuit 7 generates a status signal based on a predetermined constraint. The status signal contains data indicating a result of error detection based on the CRC codes. The host I/F 6 outputs the status signal to the communication channel 5 at a timing based on the DS signal. During a period from T2 to T3, the device controller 3 transmits the DS signal and the status signal to the host 2. The host 2 interrupts data transfer to the device controller 3 while the host 2 is receiving the status signal from the device controller 3.

The logic circuit 7 executes the write command to write the data from the host 2 into the NAND memory 4. The logic circuit 7 generates a busy signal during the period in which the data are written into the NAND memory 4. The busy signal is a signal indicating that the device controller 3 is in a busy state. In this case, the logic circuit 7 generates the busy signal because the device controller 3 is in a busy state due to writing of data into the NAND memory 4. The busy signal has a potential kept at a low level while the device controller 3 is in the busy state.

T3 represents the time when the transmission of the busy signal from the device controller 3 to the host 2 is started. T4 represents the time when the transmission of the busy signal from the device controller 3 to the host 2 is completed. The device controller 3 stops transmission of the DS signal while the busy signal is being transmitted. The host 2 interrupts data transfer to the device controller 3 while receiving the busy signal from the device controller 3.

The CAL circuit 11 adjusts the output resistance during the period from T3 to T4 that is a second period. The period from T3 to T4 is a period during which the device controller 3 is in the busy state due to writing of data into the NAND memory 4 and during which the transmission of the busy signal from the device controller 3 to the host 2 is continued.

In this manner, the CAL circuit 11 performs the calibration operation using the period during which the busy signal is transmitted, which is a period during which modulation according to the timing is not performed and the potential is constant. When the busy state of the device controller 3 is terminated, the host 2 resumes data transmission to the device controller 3 after T4.

In the data transfer to the host 2, the host I/F 6 performs either of loading of data at one pulse edge timing of the DS signal and loading of data at two pulse edge timings.

Hereinafter, "single edge" indicates that the timing at which data are loaded is either one of a rising edges and a falling edge of the DS signal. "Dual edge" indicates that the timings at which data are loaded are both of the rising edge and the falling edge of the DS signal.

When the device controller 3 performs data transfer to the host 2 as a result of executing the read command, for example, the host I/F 6 outputs the data loaded at the dual edge. The device controller 3 transmits the data loaded at the dual edge during the period from T2 illustrated in FIG. 3.

When the device controller 3 transmits the status signal to the host 2 as a result of executing the write command, the host I/F 6 outputs the status signal loaded at the single edge. The device controller 3 transmits the status signal loaded at the single edge during the period from T2 to T3 illustrated in FIG. 4.

In the case of the single edge, the host I/F 6 outputs data made to transition at either one of a period during which the potential of the DS signal is low and a period during which the potential of the DS signal is high. The host 2 loads the data made to transition in every cycle of the DS signal at one of the timings of the rising edge and the falling edge of the DS signal. In the single-edge data transfer, a sufficient timing margin for the host 2 to obtain data from the device controller 3 at accurate timings can be set relatively easily.

In contrast, in the case of the dual edge, the host I/F 6 outputs data made to transition at both of the period during which the potential of the DS signal is low and the period during which the potential of the DS signal is high. The host 2 loads the data made to transition in every half cycle of the DS signal at both of the timings of the rising edge and the falling edge of the DS signal.

In the dual-edge data transfer, the timing margin for the host 2 to obtain data from the device controller 3 at accurate timings is smaller than that in the single-edge data transfer. Thus, the influence of the variation in the drive power for the output buffer 10 on the transfer performance is greater in the dual-edge data transfer than in the single-edge data transfer.

In the case illustrated in FIG. 3 in which the standby state is terminated as a result of the reception of the read command, the device controller 3 performs the first dual-edge data transfer during the period from T2. The device controller 3 performs the adjustment with the CAL circuit 11 using the period from T1 to T2 before the first data transfer is started. This allows the device controller 3 to perform the adjustment with the CAL circuit 11 before the start of the first dual-edge data transfer after the standby state is terminated.

In the case illustrated in FIG. 4 in which the standby ate is terminated as a result of the reception of the write command, the device controller 3 performs single-edge transmission of the status signal. The device controller 3 does not perform the adjustment with the CAL circuit 11 before the transmission of the status signal. The host I/F 6 outputs the status signal with the output resistance according to the calibration coefficients that are previous adjustment results in the CAL circuit 11.

When the device controller 3 has completed writing of data as a result of executing the write command and then received a read command, the device controller 3 performs the first dual-edge data transfer. When a read command is received after the standby state is terminated as a result of reception of a write command, such a read time-out period as in the case illustrated in FIG. 3 is not set and the data transfer is immediately performed.

The device controller 3 performs the adjustment with the CAL circuit 11 using the period from T3 to T4 in the case illustrated in FIG. 4. This allows the device controller 3 to perform the adjustment with the CAL circuit 11 before the start of the first dual-edge data transfer after the standby state is terminated.

In this manner, the memory system 1 sets a period for performing the adjustment with the CAL circuit 11 during the period from the standby state until the first dual-edge data transfer is started.

The host I/F 6 performs data transmission with the output resistance according to the calibration coefficients held by the CAL circuit 11. During the period of the standby state, the CAL circuit 11 holds the calibration coefficients obtained by the calibration operation before the standby state. If the held calibration coefficients are applied to the data transfer after the standby state is terminated, the data transfer may not be performed with a proper output resistance since the calibration coefficients may deviate from proper values under conditions at the data transfer.

For example, as a result of experiencing the standby state after the active state, the device controller 3 may have a temperature lower at the termination of the standby state than that in the active state. If the calibration coefficients obtained at the high temperature in the active stat applied to the data transfer at the low temperature after the termination of the standby state, the timings of data loading will be significantly deviated.

The memory system 1 of the present embodiment sets a period for the calibration operation with the CAL circuit 11 before the first dual-edge data transfer after termination of the standby state. As a result of providing an occasion for calibration before the dual-edge data transfer that is greatly influenced by the variation in the output resistance, the memory system 1 can obtain good transfer performance when returning from the standby state.

FIG. 5 illustrates the relation between the signals and the timing of data transfer after the device controller 3 in the active state ha received either of a read command and a write command from the host 2.

In FIG. 5, T1 represents the time when the host I/F 6 completes reception of a write command or a read command from the host 2. T2 represents the time when transmission of the busy signal from the host I/F 6 to the host 2 is started during a period from reception of the command at T1 to reception of a next command. T3 represents the time when the transmission of the busy signal from the host I/F 6 to the host 2 is completed. The device controller 3 stops transmission of the PS signal while the busy signal is being transmitted. The host interrupts data transfer to the device controller 3 while receiving the busy signal from the device controller 3.

The CAL circuit 11 adjusts the output resistance during the period from T2 to T3 that is a third period. In operation resulting from execution a write command, the device controller 3 outputs a busy signal when the device controller 3 enters the busy state for writing data into the NAND memory 4. In operation resulting from execution of a read command, the device controller 3 adjusts the output resistance during the third period that is a period after data are read from the NAND memory 4 until the data are output.

The CAL circuit 11 performs e calibration operation using the period during which the busy signal is transmitted, which is a period during which modulation according to the timing is not performed and the potential is constant. As described above, the memory system 1 sets a period for performing the adjustment with the CAL circuit 11 during a period in the active state. In the active state, the calibration operation is performed at appropriate intervals.

The memory system 1 uses a period in the busy state for the calibration operation, which enables the calibration operation to be performed without affecting the periods for data transfer. As a result, the memory system can continue data transfer with high performance without causing delay in the data transfer in the active state.

Here, calibration in an enhanced strobe mode that is one of operations modes of the memory system 1 will be described. In the enhanced strobe mode, after receiving read command or a write command, the device controller 3 makes the DS signal toggle to a response to the command. The device controller 3 transmits the response and the DS signal to the host 2. The host 2 loads the response at the timing of the DS signal.

When the device controller 3 transmits the response to the host 2, the host I/F 6 outputs data loaded at the single edge. A sufficient timing margin for the host 2 to obtain a response at an accurate timing can be set relatively easily. Thus, in the enhanced strobe mode, the CAL circuit 11 does not perform the calibration operation after reception of a command is completed until a response is transmitted.

Figure 6:
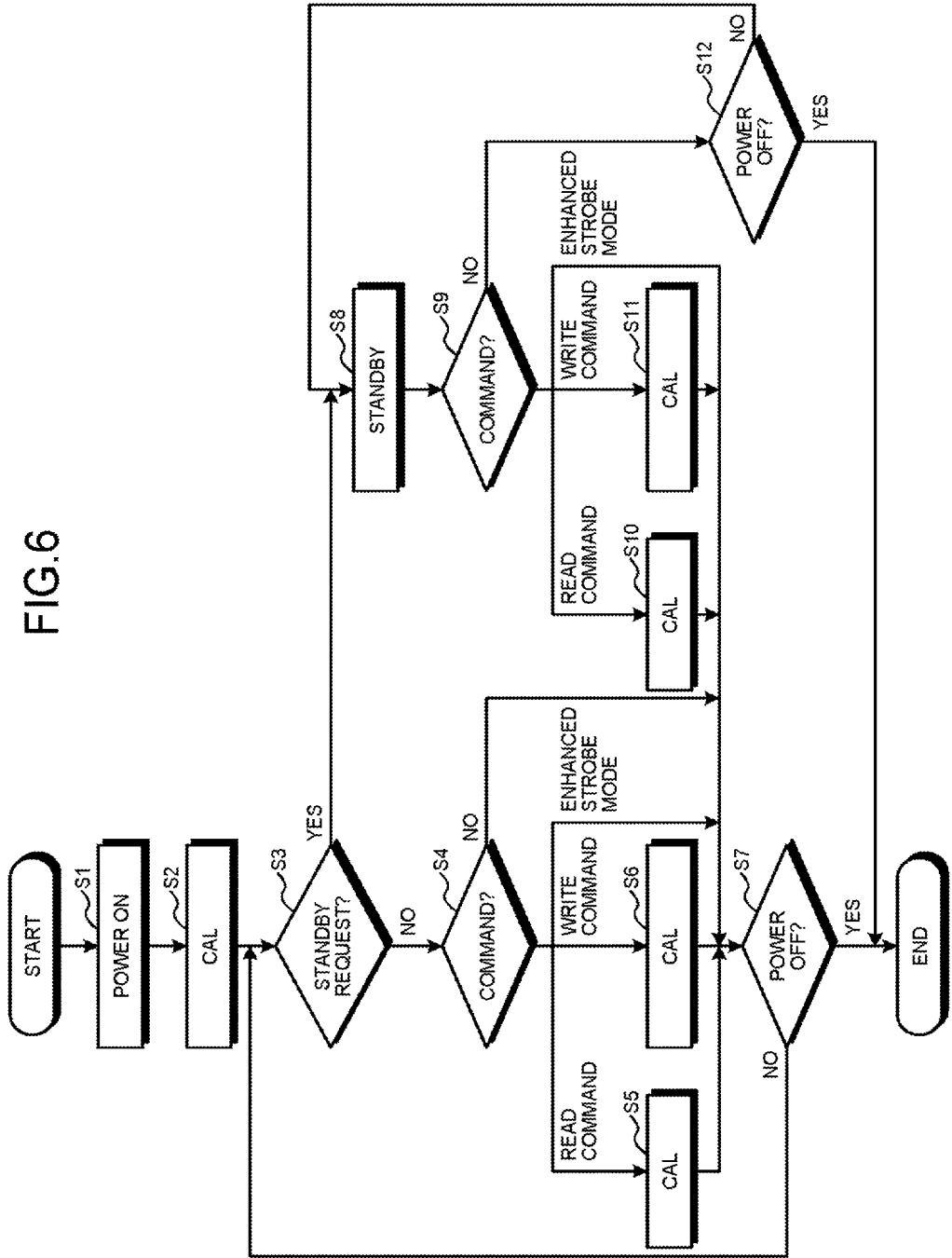
FIG. 6 is a flowchart explaining timings at which calibration is performed in the memory system illustrated in FIG. 1.

FIG. 6 is a flowchart explaining the timings at which calibration is performed in the memory system illustrated in FIG. 1. In step S1, the memory system 1 is powered on. After power-on in step S1, the CAL circuit 11 performs calibration in step S2.

In step S3, after the calibration in step S2, it is determined whether or not a standby request is made from the host 2 to the device controller 3. A "standby request" is a request for switching the device controller 3 from the active state to the standby state.

If the standby request is not made (step S3, No), it is determined in step S4 whether or not the device controller 3 has received a command from the host 2. In step S4, the device controller 3 determines whether or not a command is received in the active state. If a command is received in step S4, the device controller 3 executes the command.

If a read command is received in step S4, the device controller 3 performs operation resulting from the execution of the read command. The CAL circuit 11 performs calibration in a period during which the device controller 3 transmits a busy signal after data reading operation (step S5).

If a write command is received in step S4, the device controller 3 performs operation resulting from execution of the write command. The CAL circuit 11 performs calibration in a period during which a busy signal is transmitted from the host I/F 6 during data writing operation (step S5). In step S5, the CAL circuit 11 performs the calibration in the third period described with reference to FIG. 5. If the command is received in the enhanced strobe mode in step S4, the CAL circuit 11 does not perform calibration.

In step S7, it is determined whether or not the memory system 1 is powered off in the active state. If the command received in step S4 is executed and the memory system 1 is not powered off(step S7, No), the memory system 1 repeats the operation from step S1. If no command is received in step S4 (step S4, No) and the memory system 1 is not powered off(step S7, No), the memory system also repeats the operation from step S3. The device controller 3 waits for reception of a command in step S4 in the active state.

If a standby request is made (step S3, Yes), the device controller 3 switches the state from the active state to the standby state (step S8). In step S9, the device controller 3 determines whether or not a command is received in the standby state.

When a read command is received in step S9, the device controller 3 terminates the standby state and switches to the active state. The device controller 3 performs operation resulting from execution of the read command. The CAL circuit 11 performs calibration in a period from when the host I/F 6 completes reception of the read command to when the host I/F 6 starts data transmission to the host 2 (step S10). In step S10, the CAL circuit 11 performs the calibration in the read time-out period that is the first period described with reference to FIG. 3.

When a write command is received in step S8, the device controller 3 terminates the standby state and switches to the active state. The device controller 3 performs operation resulting from execution of the write command. The CAL circuit 11 performs calibration in a period during which a busy signal is transmitted from the host I/F 6 during data writing operation (step S11). In step S11, the CAL circuit 11 performs the calibration in the second period described with reference to FIG. 4.

If the command is received in the enhanced strobe mode in step S9, the CAL circuit 11 does not perform calibration. After the command received in step S9 is executed, the procedures from step S7 are performed.

In step S12, it is determined whether or not the memory system 1 is powered off in the standby state. If no command is received in step S9 (step S9, No) and the memory system 1 is not powered off (step S12, No), the device controller 3 returns to step SB and maintains the standby state. The device controller 3 repeats the operation from step SS. The device controller 3 waits for reception of a command in step S9 in the standby state.

If the memory system 1 is powered off in step S7 (step S7, Yes), the memory system 1 terminates the operation. If the memory system 1 is powered off in step S12 (step S12, Yes), the memory system 1 also terminates the operation.

According to the first embodiment, the memory system 1 adjusts the output resistance during the first period or during the second period. The memory system 1 can achieve good transfer performance when returning from the standby state.

The memory system 1 adjusts the output resistance during the third period. The memory system 1 can continue data transfer with high performance without causing delay in the data transfer in the active state. As a result, the memory system 1 can produce an advantageous effect of being capable of performing data transfer with good transfer performance.

Second Embodiment

Figure 7:
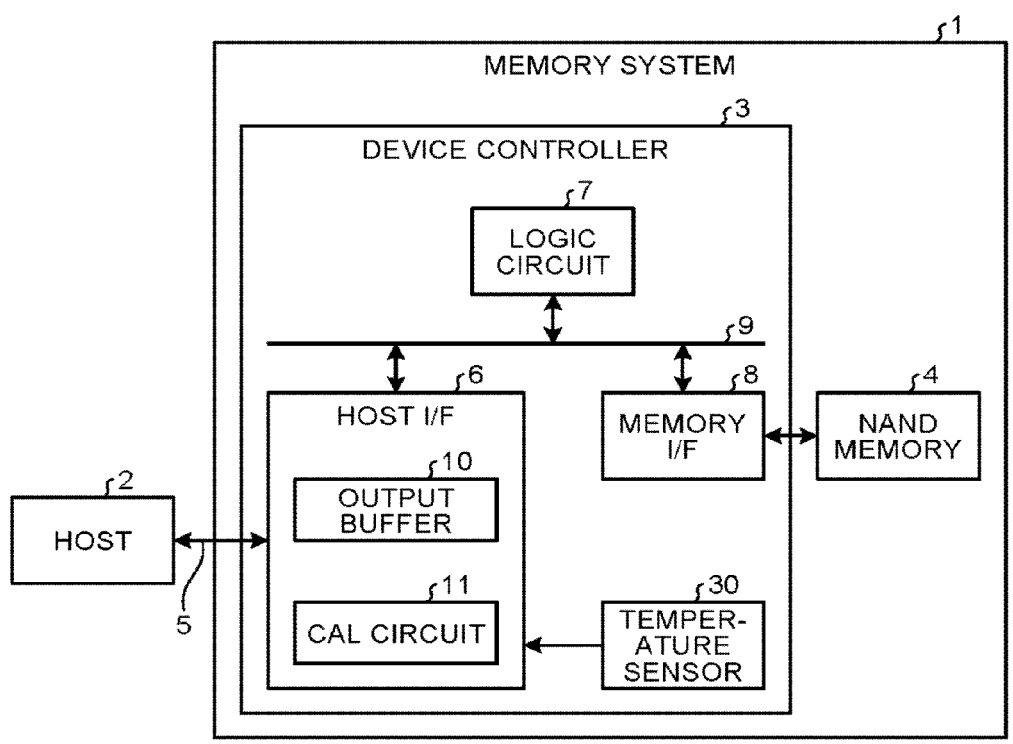
FIG. 7 is a block diagram of an information processing device including a memory system according to a second embodiment.

FIG. 7 is a block diagram of an information processing device including a memory system according to a second embodiment. Parts that are the same as those in the first embodiment will be designated by the same reference numerals and redundant description thereof will not be repeated as appropriate.

In the second embodiment, a device controller 3 is provided with a temperature sensor 30 in addition to the components of the device controller 3 of the first embodiment. The temperature sensor 30 detects the temperature of the device controller 3. The temperature sensor 30 outputs the result of detecting the temperature to the host I/F 6.

The CAL circuit 11 performs calibration at power-on regardless of the detection result of the temperature sensor 30. As a result, the memory system 1 performs adjustment with respect to variation in the output resistance due to the manufacturing process regardless of the temperature of the device controller 3.

The CAL circuit 11 determines whether or not calibration in a period other than the power-on period according t the detection result f the temperature sensor 30. If the detection result of the temperature sensor 30 does not exceed a threshold, the CAL circuit 11 does not perform calibration in a period other than the power-on period. If the detection result of the temperature sensor 30 exceeds the threshold, the CAL circuit 11 performs calibration in the first, second, and third periods similarly to the first embodiment. The CAL circuit 11 holds a preset threshold.

If the detection result of the temperature sensor 30 does not exceed the threshold, the CAL circuit 11 determines that the variation in the output resistance due to a change in the temperature is small. In this case, the CAL circuit 11 omits the calibration other than that performed at power-on.

If the detection result of the temperature sensor 30 exceeds the threshold, the CAL circuit 11 determines that the variation in the output resistance due to a change in the temperature is large. In this case, the CAL circuit 11 performs the calibration in the first, second, and third periods in addition to the calibration performed at power-on.

According to the second embodiment, the memory system 1 performs the calibration in the first, second, and third periods when the detection result of the temperature sensor 30 exceeds the threshold. As a result, the memory system 1 can adjust the output resistance when the variation in the output resistance is determined to be large. In the second embodiment, the memory system 1 can also produce an advantageous effect of being capable of performing data transfer with good transfer performance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a memory; and
a controller, capable of being connected to a host, for controlling data transfer between the memory and the host, a state of the controller being switched between a first state in which operation is caused by execution of a command and a second state in which power consumption is lower than that in the first state, a first command being a command for reading data from the memory, a second command being a command writing data into the memory, wherein
the controller includes an interface for connecting to the host to enable communication with the host,
the interface includes a circuit configured to adjust output resistance for data output,
when the interface has received the first command in the second state, the circuit adjusts output resistance during a first period, the first period being a period from when the interface completes reception of the first command to when the interface starts transmission of data read from the memory,
when the interface has received the second command in the second state, the circuit adjusts output resistance during a second period, the second period being a period from when the interface starts transmission of a busy signal to when the interface completes the transmission, and
the circuit adjusts output resistance during a third period in the first state.

2. The memory system according to claim 1, wherein the third period is a period from when the interface starts transmission of a busy signal to when the interface completes the transmission.

3. The memory system according to claim 1, wherein when the interface has received the first command in the first state, the circuit adjusts output resistance during the third period, the third period being a period from when the interface starts transmission of a busy signal to when the interface completes the transmission in operation caused by execution of the first command.

4. The memory system according to claim 1, wherein when the interface has received the second command in the first state, the circuit adjusts output resistance during the third period after data are read from the memory until the data are output.

5. The memory system according to claim 1, wherein the circuit adjusts the output resistance when the controller is powered on.

6. The memory system according to claim 1, wherein the interface continues to transmit the busy signal while the controller is in a busy state for writing data into the memory.

7. The memory system according to claim 1, wherein the controller includes a sensor that detects a temperature of the controller, and
when a detection result of the sensor exceeds a preset threshold, the circuit adjusts output resistance during the first period or the second period.

8. The memory system according to claim 2, wherein the controller includes a sensor that detects a temperature of the controller, and
when a detection result of the sensor exceeds a preset threshold, the circuit adjusts output resistance during the third period.

9. A memory system comprising:
a memory; and
a controller, capable being connected to a host, for controlling data transfer between the memory and the host, a state of the controller being switched between a first state in which operation is caused by execution of a command and a second state in which power consumption is lower than that in the first state, wherein
the controller includes an interface for connecting the host to enable communication with the host, the interface including a circuit configured to adjust output resistance for data output,
the interface performs data transmission of transmitting data loaded at timings of both of pulse rise and pulse fall of a timing signal according to a received command, and
the circuit adjusts output resistance during a period from when the interface completes reception of a command when the interface starts the data transmission in the second state.

10. The memory system according to claim 9, wherein the circuit adjusts output resistance in a period from when the interface starts transmission of a busy signal to when the interface completes the transmission in the first state.

11. The memory system according to claim 9, wherein when the interface has received a command for reading data from the memory in the second state, the circuit adjusts output resistance during a period until the data transmission of data read from the memory is started.

12. The memory system according to claim 9, wherein when the interface has received a command for writing data into the memory in the second state, the circuit adjusts output resistance during a period from when the interface starts transmission of a busy signal to when the interface completes the transmission in operation caused by execution of the received command.

13. The memory system according to claim 12, wherein the interface continues to transmit the busy signal while the controller is in a busy state for writing data into the memory.

14. The memory system according to claim 9, wherein the circuit adjusts output resistance when the controller is powered on.

15. The memory system according to claim 9, wherein the controller includes a sensor that detects a temperature of the controller, and
when a detection result of the sensor exceeds a preset threshold, the circuit adjusts output resistance during a period from when the interface completes reception of a command to when the interface starts the data transmission in the second state.

16. A control method of a memory system, the memory system including a memory and a controller for controlling data transfer between the memory and a host, the controller including an interface for connecting to the host to enable communication with the host, the control method comprising:
switching the controller from a second state to a first state when the interface has received a command while the controller is in the second state, the first state being a state in which operation is caused by execution of a command, the second state being a state in which power consumption is lower than that in the first state; and
adjusting output resistance for data output from the interface during one of a first period and a second period, the first period being a period from when the interface completes reception of a first command to when the interface starts transmission of data read from the memory, when the interface has received the first command in the second state, the first command being a command for reading data from the memory, the second period being a period from when the interface starts transmission of a busy signal to when the interface completes the transmission, when the interface has received a second command in the second state, the second command being a command for writing data into the memory.

17. The control method according to claim 16, comprising:

adjusting output resistance for data output from the interface during a third period, the third period being a period from when the interface starts transmission of a busy signal to when the interface completes the transmission in the first state.

18. The control method according to claim 16, comprising:

adjusting output resistance for data output from the interface during a third period, the third period being a period from when the interface starts transmission of a busy signal to when the interface completes the transmission in operation caused by execution of the first command, when the interface has received the first command in the first state.

19. The control method according to claim 16, comprising:

adjusting output resistance for data output from the interface during a third period, the third period being a period after data are read from the memory until the data are output, when the interface has received the second command in the first state.

20. The control method cording to claim 16, comprising:

adjusting output resistance for data output from the interface when the controller is powered on.

* * * * *